United States Patent
Lai et al.

(10) Patent No.: US 7,336,211 B1
(45) Date of Patent: Feb. 26, 2008

(54) RESISTANCE COMPENSATED DAC LADDER

(75) Inventors: Tin H. Lai, San Jose, CA (US); Wilson Wong, San Francisco, CA (US)

(73) Assignee: Altera Corporation, San Jose, CA (US)

( * ) Notice: Subject to any disclaimer, the term of this patent is extended or adjusted under 35 U.S.C. 154(b) by 3 days.

(21) Appl. No.: 11/336,443

(22) Filed: Jan. 20, 2006

(51) Int. Cl.
*H03M 1/78* (2006.01)

(52) U.S. Cl. .................. 341/154; 341/118; 341/144

(58) Field of Classification Search ............... 341/118, 341/136, 154
See application file for complete search history.

(56) References Cited

U.S. PATENT DOCUMENTS

| | | | | |
|---|---|---|---|---|
| 3,755,807 A | * | 8/1973 | Brown | 341/136 |
| 4,267,550 A | * | 5/1981 | Cecil | 341/118 |
| 4,381,499 A | * | 4/1983 | Struthoff | 341/118 |
| 4,551,709 A | * | 11/1985 | Merchant et al. | 341/136 |
| 4,591,826 A | | 5/1986 | Seiler | |
| 4,631,522 A | * | 12/1986 | Cabot | 341/118 |
| 4,713,649 A | * | 12/1987 | Hino | 341/133 |
| 4,843,394 A | * | 6/1989 | Linz et al. | 341/154 |
| 5,525,986 A | | 6/1996 | Kovacs et al. | |
| 5,781,140 A | * | 7/1998 | Kao | 341/154 |
| 6,310,567 B1 | * | 10/2001 | Copley et al. | 341/139 |
| 6,380,877 B2 | * | 4/2002 | Castaneda et al. | 341/154 |
| 6,633,246 B1 | * | 10/2003 | Bowers | 341/136 |
| 2006/0232458 A1 | * | 10/2006 | Copley | 341/144 |

* cited by examiner

*Primary Examiner*—Khai M. Nguyen
(74) *Attorney, Agent, or Firm*—Townsend and Townsend and Crew LLP

(57) ABSTRACT

Circuits, methods, and apparatus for inhibiting non-monotonic output voltage behavior in an R-2R ladder digital to analog converter (DAC). Resistance values of selected resistors of the R-2R ladder are designed to compensate for finite resistances of switches and for variances within the resistances of the resistors and of the switches. The compensating resistance values dampen or eliminate the non-monotonic behavior in the DAC.

21 Claims, 7 Drawing Sheets

Thevenin Example: R-2R Ladder

US 7,336,211 B1

RESISTANCE COMPENSATED DAC LADDER

BACKGROUND

The present invention relates generally to digital to analog converters (DAC) and more particularly to R-2R ladder DACs.

DACs convert a binary input into an analog output voltage. DACs are widely used in disc drive read channels, digital sound and video systems, and many consumer electronics. Modern applications and electronic devices require ever greater resolution to meet the increasing demands of users, such as greater image quality. However, increasing the resolution of a DAC can increase nonlinearities in the output.

For an ideal DAC, every increment of the binary input increases the output voltage by exactly the same amount $V_{LSB}$. However, real DACs exhibit integral and differential nonlinearities. Integral nonlinearity is the deviation from a line between zero and full scale. Differential non-linearity is a measure of the worst case deviation from the ideal one $V_{LSB}$ step. For example, a DAC with a 1.5 $V_{LSB}$ output change for a 1 least significant bit (LSB) digital code change exhibits 0.5 LSB differential nonlinearity, and a 1 $V_{LSB}$ output change has 0 LSB differential nonlinearity. Differential non-linearity may be expressed in fractional bits or as a percentage of full scale. A differential non-linearity greater than 1 LSB will lead to a non-monotonic transfer function in a DAC. Thus, there would be an undesirable sign change in the slope of the transfer curve.

For many applications, it is beneficial to have a continuous and monotonically increasing voltage output, which may be more important than accuracy. A DAC which is monotonic will be more desirable for applications where the small-signal performance is of importance or possibly where the DAC is in a feedback loop. If a DAC is monotonic, it's output voltage will always increase for increasing values of binary input, and vice versa.

Thus, what is needed are DACs that have relatively small deviations from monotonic behavior and are cost effective to manufacture.

SUMMARY

Accordingly, embodiments of the present invention provide circuits, methods, and apparatus for controlling the resistance of circuit elements to compensate for nonlinearity in the output of a digital to analog converter. One embodiment of the present invention has the resistances of selected resistors set to compensate for the finite resistance of a switch. In one embodiment, a selected resistor in series with a switch is decreased by the finite resistance of the switch. In another embodiment, a selected resistor in parallel with the switch is increased by one-half of the finite resistance of the switch. The finite resistance of each switch in the digital to analog converter may be compensated differently and by different amounts.

A further embodiment of the present invention provides for progressively increasing or decreasing changes in the resistances of resistors to dampen the effects of variances in resistances throughout the circuit. The progressive changes may start with an offset, begin at different points in the ladder, and have step-wise behavior where the resistances do not change for a certain portion of the digital to analog converter. In some embodiments, the progressive change is a linear increase or decrease in the resistance of theresistors. In other embodiments, the change may be exponential, logarithmic, polynomial, or another functionally beneficial change.

A better understanding of the nature and advantages of the present invention may be gained with reference to the following detailed description and the accompanying drawings.

DESCRIPTION OF EXEMPLARY EMBODIMENTS

Embodiments of the present invention are directed to high accuracy digital to analog (DAC) converters, and more particularly to R-2R ladder DACs. Increasing the resolution of a DAC introduces certain problems. For example, current source DACs generally double in size for each additional bit added. An alternate form of DAC, the R-2R ladder DAC, grows linearly, i.e., it simply adds one more R and 2R resistor pair for each additional bit of resolution, along with a switch to control the extra bit. However, R-2R ladder DACs are susceptible to increased output voltage non-linearities. Embodiments of the present invention reduce the non-linearity.

Figure 1:
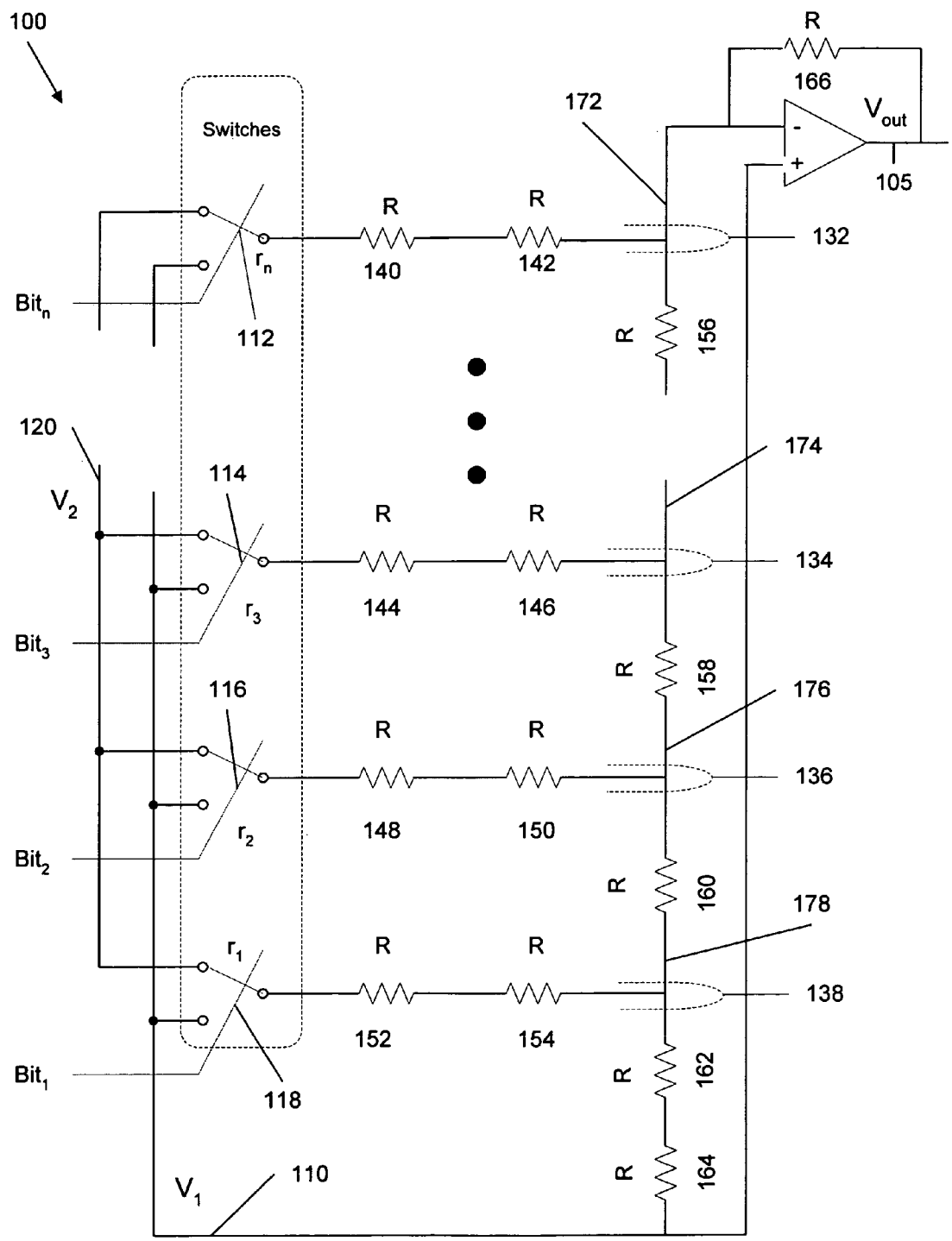
FIG. 1 is a schematic of an R-2R ladder that is improved by incorporating an embodiment of the present invention.

FIG. 1 shows an R-2R ladder circuit 100 wherein techniques according to the present invention can be utilized. The ladder 100 takes an n-bit binary input using $Bit_1$ to $Bit_n$. The ladder 100 converts the binary input into an analog voltage level $V_{out}$ at line 105. The inputs of the ladder 100 are controlled by switches 112-118. The inputs are switched between a first voltage reference $V_1$ on line 110 and a second voltage reference $V_2$ on line 120. The switch 112 for the most significant bit (MSB) is controlled directly by Bit n of the binary input, the switch for the next most significant step is controlled by the second most significant bit of the binary input, and so forth. In the ladder 100, the resistors 140-166 have approximately equal resistance R within manufacturing tolerances.

Each of the rungs 132-138 of the ladder 100 contain a switch and two resistors of resistance R. For instance, rung 138 contains switch 118 and resistors 152 and 154. The respective outputs 172-178 of the rungs 132-138 are connected to each other through additional resistors 156-160. The output analog voltage $V_{out}$ on line 105 is obtained from the output 172 of the most significant bit (MSB). In order to provide a more stable $V_{out}$, the output voltage may be connected to output 172 through amplifier 170 with feedback resistor 166. The output 178 of the least significant bit (LSB) is connected to $V_1$ through two resistors 162-164 and is furthest from output line 105 of the circuit.

A binary input of $Bit_n=1$ will cause switch 112 to connect the input of rung 132 to $V_2$, and a binary input of $Bit_1=1$ will cause switch 118 to connect the input of rung 138 to $V_2$. The circuit pattern of ladder 100 is such that the input voltage for rung 132 contributes more to $V_{out}$ than the input voltage at rungs associated with less significant bits, such as rung 138. The structure of the contributions is described below.

Figure 2:
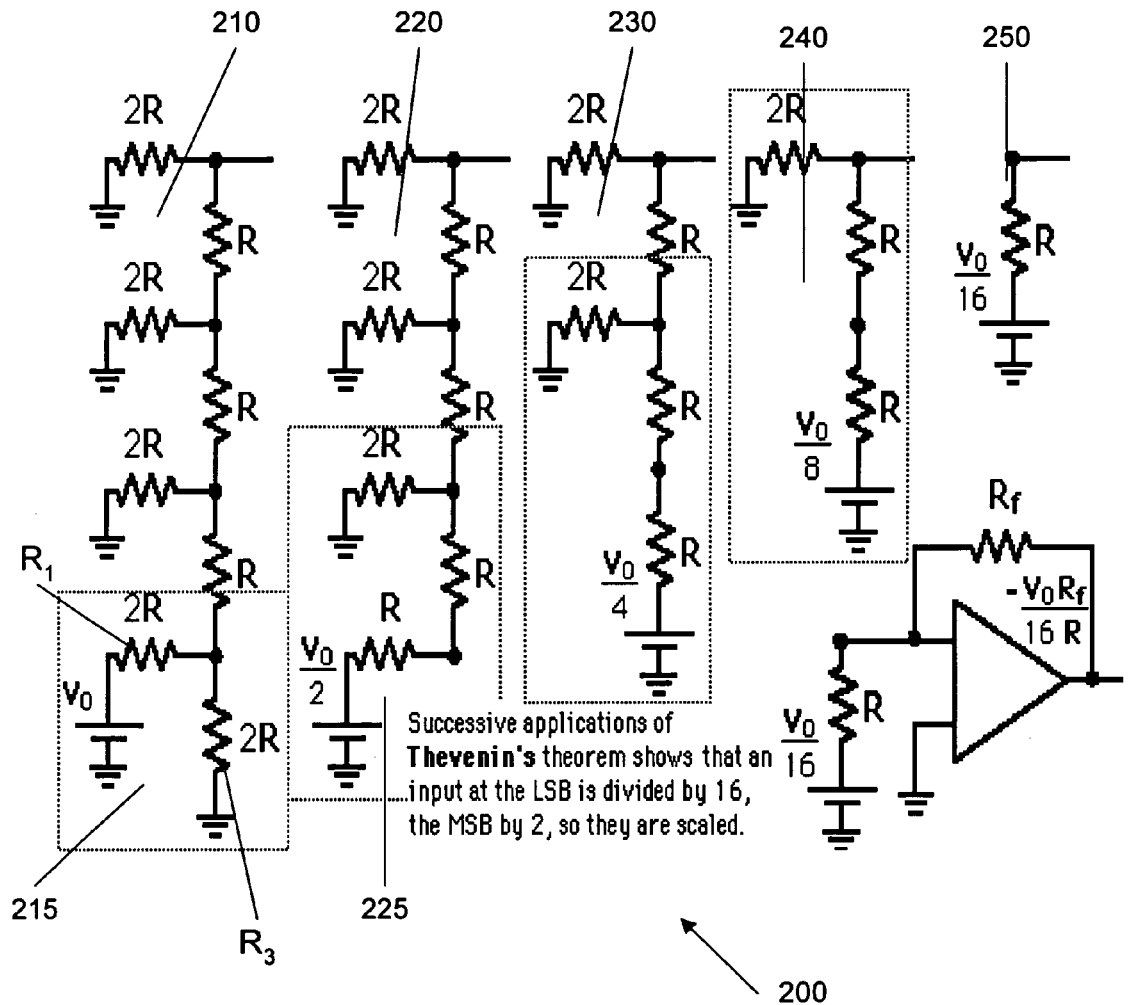
FIG. 2 is a schematic of successive R-2R ladders illustrating the application of Thevenin's theorem.

FIG. 2 shows a successive group 200 of equal ideal circuits 210-250. In this example, n=4, $Bit_1=1$ and the rest of the Bits equal 0. Thus, FIG. 2 shows the voltage contribution from $Bit_1$ at each rung output 172-178 in the ladder 100 including $V_{out}$. For simplicity, the two resistors of a rung have been replaced by a resistor of resistance 2R, and similarly resistors 162 and 164 have been replaced by a single 2R resistor. Also, $V_0=V_2-V_1$ and $V_1$=ground.

The sub-circuit 215 of circuit 210 is equivalent to a single voltage source $V_e=V_0/2$ and a single resistor of value R based on Thevenin's theorem. Circuit 220 has this equivalent structure of sub-circuit 215 replaced, and thus circuit 220 is equivalent to circuit 210. The equivalent voltage is calculated via the formula $V_e=V_0 (R_3/(R_1+R_3))$. $R_1$ equals the combined resistance of resistors 152 and 154, so $R_1=R_{152}+R_{154}$ is the resistance of the rung 138. $R_3$ is the resistance of resistors 162 and 164, which make up the resistance of the ladder 100 below rung 138. The two 2R resistors in parallel are equivalent to a single R according to the formula $(R_1*R_3)/(R_1+R_3)$. With the values from circuit 210, this formula gives $[(2R)^2/(2R+2R)]=R$.

Circuits 230-250 show repeated application of Thevenin's formula. At each stage the voltage drops by one-half and the effective resistance is R. Accordingly, Thevenin's theorem can provide for the relation between the binary input and $V_{out}$ as follows.

The resolution of the circuit 100 is dependent on n, $V_1$, and $V_2$. There are $2^n$ voltage levels between two reference voltage levels $V_1$ and $V_2$. When the input increases in binary sequence from 0 to $(2^n-1)$, output increases monotonically by a voltage increment equal to the resolution $(V_2-V_1)(1/2^n)$. For example if n=4, the output voltage $V_{out}$ would follow the equation, $$V_{out} = (V_2 - V_1)\left(\frac{Bit_1}{16} + \frac{Bit_2}{8} + \frac{Bit_3}{4} + \frac{Bit_4}{2}\right).$$

Alternatively, the output may decrease depending on the most/least significant bit location assignment. As one can see, the MSB of n=4 gives the greatest contribution to $V_{out}$. For an ideal R-2R ladder having all resistors with exactly equal resistance R and having ideal switches with zero resistance, the value of $V_{out}$ is unique for a given binary input.

Figure 3:
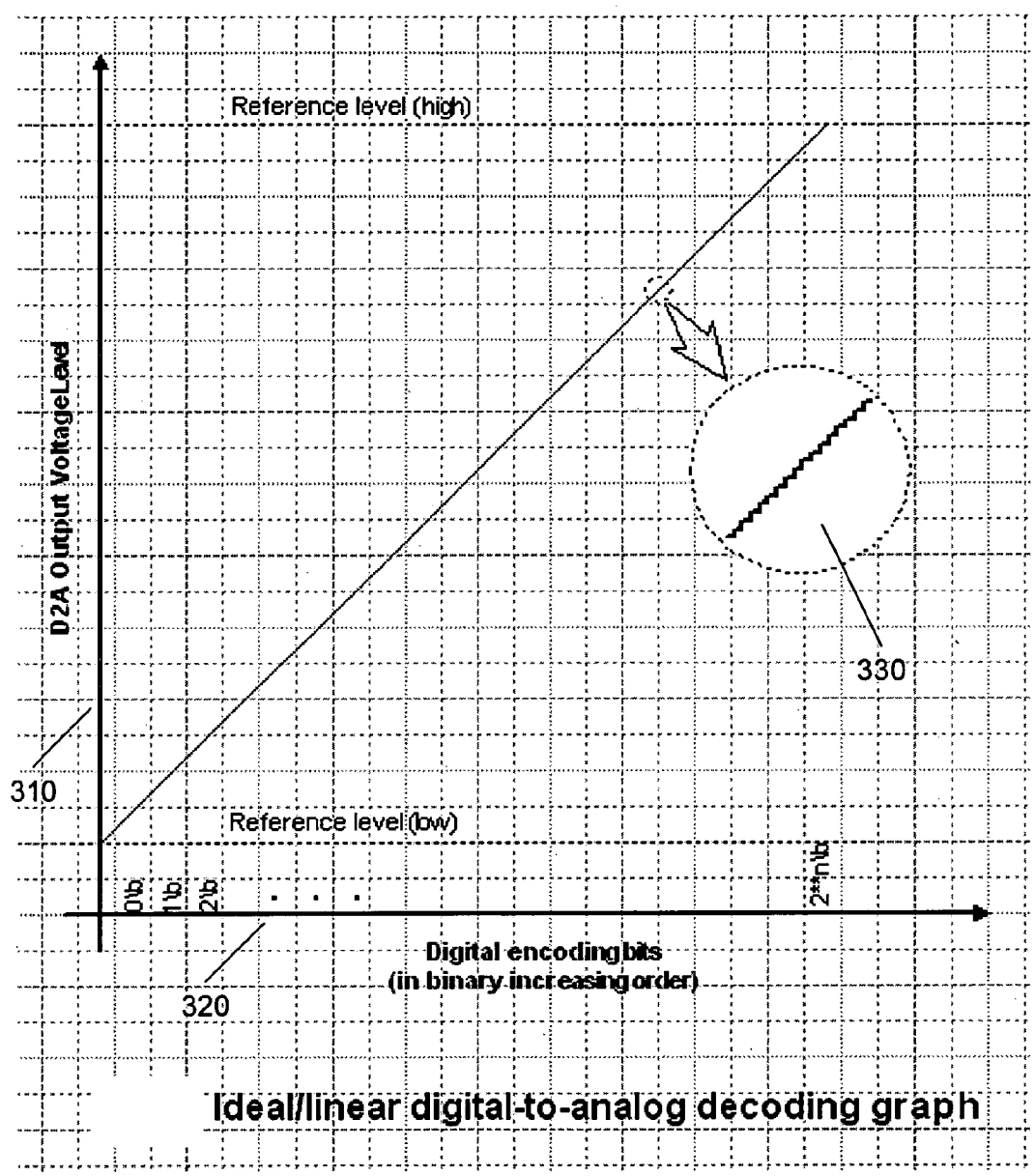
FIG. 3 is a graph of voltage as a function of binary input values for an ideal R-2R ladder.

FIG. 3 shows the ideal voltage output versus increasing binary input for ladder 100. The Y axis 310 is the output voltage $V_{out}$ and the X axis 320 is the binary input that is being encoded into analog form. Each increase in the binary number causes a corresponding linear increase in the output voltage level. The magnified view 330 shows that the line is a series of incremental steps. Each step is of the same amount $(V_2-V_1)(1/2^n)$. The result is a monotonically increasing step function that approximates a line of slope $(V_2-V_1)(1/2^n)$.

However, the actual output voltage will not follow the ideal graph in FIG. 3. Real switches have finite resistance. In FIG. 1, the switches have resistances $r_1$-$r_n$. This finite resistance limits the minimum resolution and causes unequal voltage increments depending on the binary input. This reduced linearity results in more distortion for every application of digital-to-analog converters. The unequal voltage increments are caused by the resistance of a rung and the resistance of the ladder 100 below the rung not being equal. Thus, application of Thevenin's theorem does not give the ideal voltage values or the ideal resistor values.

For example, the total resistance of rung 138 gives $R_1=r_1+2R$, and the resistance of the circuit below gives $R_3=2R$. Using Thevenin's theorem, the voltage at output 178 is no longer $V_0/2$, but is a lower value since $R_3/(R_1+R_3)<1/2$. The overall effective resistance of rung 138 in parallel with resistors 162 and 164 is $2R(r_1+2R)/(4R+r_1)$.

Considering rung 136, the overall resistance of the circuit below rung 136 has increased due to the resistance $r_1$ of switch 118. However, the increase is not large enough to offset the additional resistance r of switch 116. Thus, the voltage value at 176 from $Bit_2$ will also be lower than in the ideal case. Overall, the total resistance of the circuit below a rung is different for every rung due to the finite resistance of the switches. Accordingly, the differences from the ideal voltage amount will be different at each output of each rung. The result is that the steps in $V_{out}$ are no longer equivalent. The differences in the steps of $V_{out}$ will vary depending on the significance of the Bits that change.

By virtue of the R-2R ladder design, resistance discrepancy weights the MSB highest. The MSB contributes a voltage of approximately $V_0/2$, which is greater than other Bits. The resistance mismatch due to finite resistance switches will thus give the greatest impact on the output voltage $V_{out}$ when the MSB changes. Even though the finite resistance of the switches does increase the resistance of the resistors in the circuit below, the resistance value will have an asymptotic limit. For R=4700 Ohms and r=28 Ohms the limit is about 4709.327 Ohms. Thus, the higher weighting of the resistance mismatch associated with the MSB is not severely dampened by a decrease in the resistor mismatch. This weighting of resistance mismatch for different Bits can be seen in FIG. 4.

Figure 4:
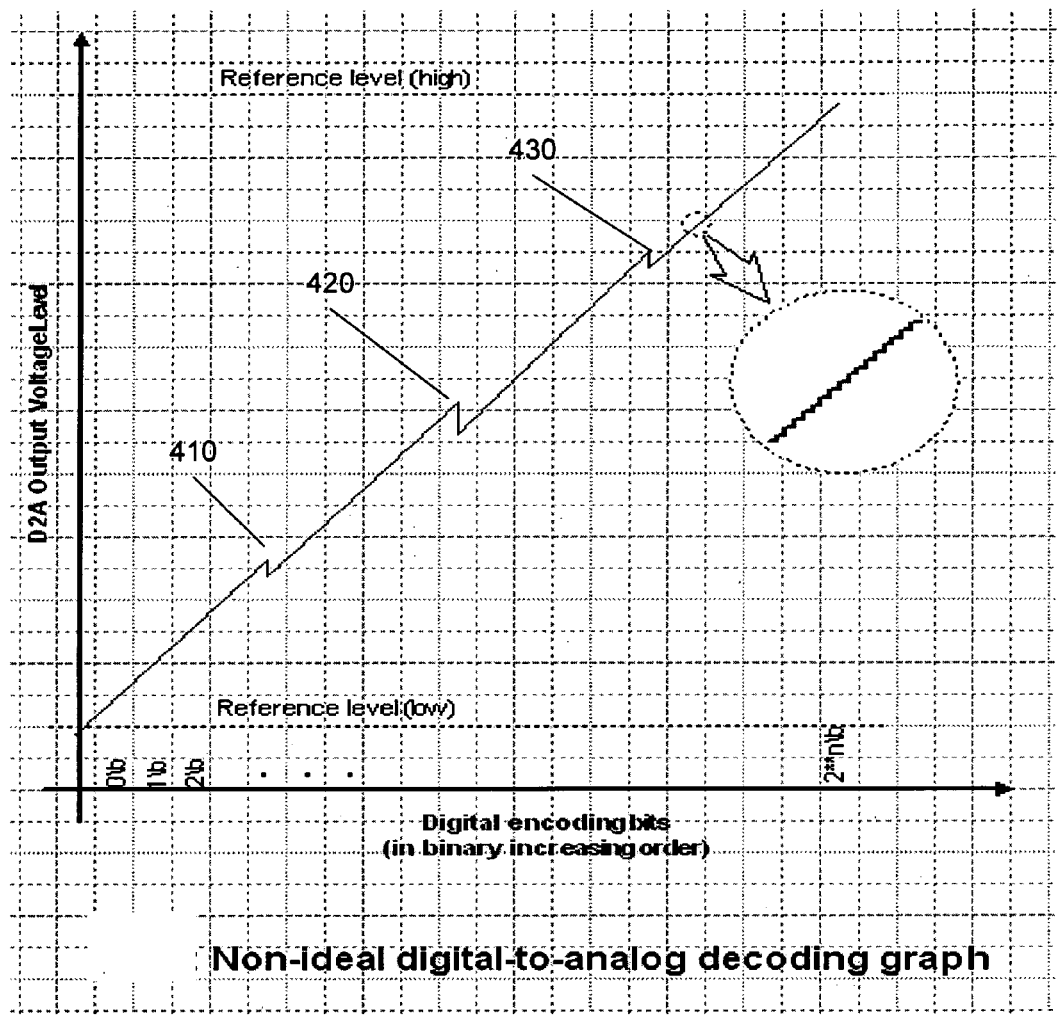
FIG. 4 is a graph of voltage as a function of binary input values for an R-2R ladder with finite switch resistance.

FIG. 4 shows the actual voltage output versus increasing binary input for ladder 100 with finite resistance switches. FIG. 4 shows spikes 410-430 that occur due to the resistance mismatch. The spike 420 in the middle corresponds in the shift from binary input $2^{n-1}$ to $2^{n-1}+1$. This shift is when the most significant bit (MSB) becomes 1 and the rest of the Bits become zero. The voltage decreases since the resistance on rung 132 is $r_n+2R$, which is greater than the resistance on the rest of the circuit. Using Thevenin's formula, the voltage $V_0$ is less than $(V_2-V_1)/2$, which is the ideal correct value. When the placement of the MSB gives a decreasing output graph, then the voltage spike is in the positive direction.

Figure 5:
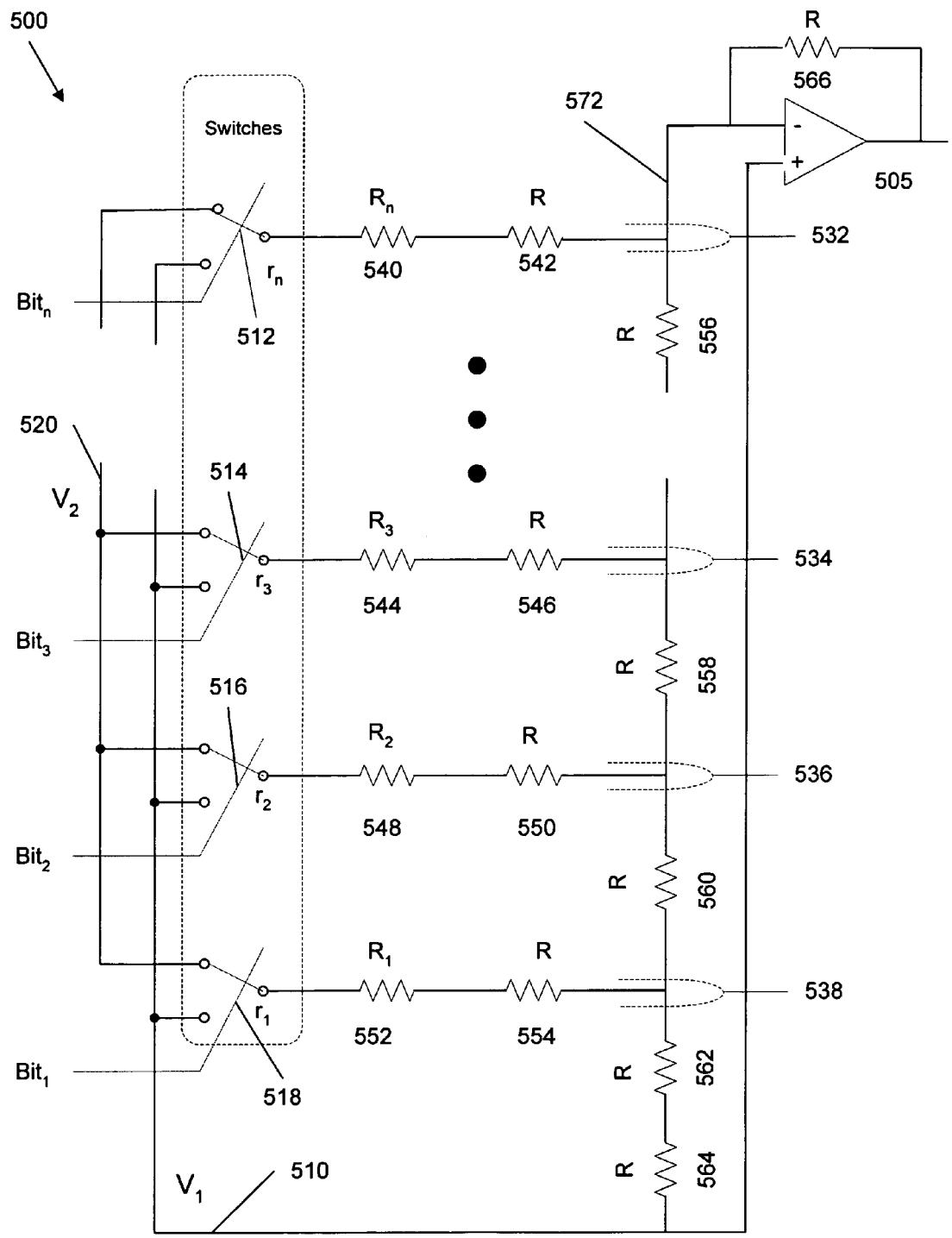
FIG. 5 is a schematic of an R-2R ladder according to an embodiment of the present invention.

FIG. 5 shows an R-2R ladder circuit 500 according to an embodiment of the invention. Ladder 500 has a similar overall structure as ladder 100 of FIG. 1. However, in this embodiment, the total resistance of a rung has been made to equal the resistance of the circuit below the rung. Some resistors of nominal resistance R have been altered to a different resistance. For example, the resistors on rung 538 satisfy the matching condition $(r_1+R_{552}+R_{554})=(R_{562}+R_{564})$. Similar changes may be made for other rungs. The change in $R_{552}$ and/or $R_{554}$ may be of any values that compensate for the finite resistance of $r_1$. In one embodiment, only one resistor is altered to have a resistance different from R, e.g.

$R_{554}=R-r_1$. In another embodiment, the values of $R_{552}=R_{554}=R-1/2r_1$. In yet another embodiment, the value of $R_{562}=R_{564}=R+1/2r_1$. One skilled in the art would recognize the many different possibilities of resistor value combination that would satisfy the matching conditions.

The resistances $r_1$-$r_n$ of the switches may be approximately equal. In such embodiments, the changes to the resistors may be similar for each rung. In other instances, the resistances $r_1$-$r_n$ may progressively change. So if $r_1<r_2<r_3< \ldots <r_n$, then an embodiment could have $R_1>R_2>R_3> \ldots >R_n$, and if $r_1>r_2>r_3> \ldots >r_n$, then an embodiment could have $R_1<R_2<R_3< \ldots <R_n$.

One may calculate the magnitude and order of the switch resistance from simulation or measurement. The degree of non-linearity when the nth, (n−1)th, ..., 3rd, 2nd, and 1st Bit locations change provides the magnitude and order of the switch resistances. Specifically, the relative magnitude of voltage drop at nth, (n−1)th, ..., 3rd, 2nd, and 1st location reveal the relative value of $r_n$, $r_{n-1}$, ..., $r_3$, $r_2$, and $r_1$ from which we obtain the order of resistance for the switch resistance.

Besides errors caused by finite resistances of the switches, there are also errors caused by variance among the actual resistance of the resistors R. The variance may be due to manufacturing tolerances. The unequal voltage increments again result from the resistance of a rung and the resistance of the circuit 100 below the rung not being equal. Thus, Thevenin's theorem does not give the proper voltage values or the proper resistor values. The difference from the problem of the switches having a finite resistance is that the errors do not follow a regular pattern as with the constant shift up in resistance of a rung due to the finite resistance of a switch.

Additionally, real switches possibly have small, finite differences in resistance. For example, in some circuits, where the switch is a PMOS pass gate, the bias voltage may vary. The varying of the bias voltage may cause the resistance of the switches to vary as well. The resistance values also may not follow any predetermined or easily accessible pattern. The exact variance also may not easily ascertainable.

Figure 6:
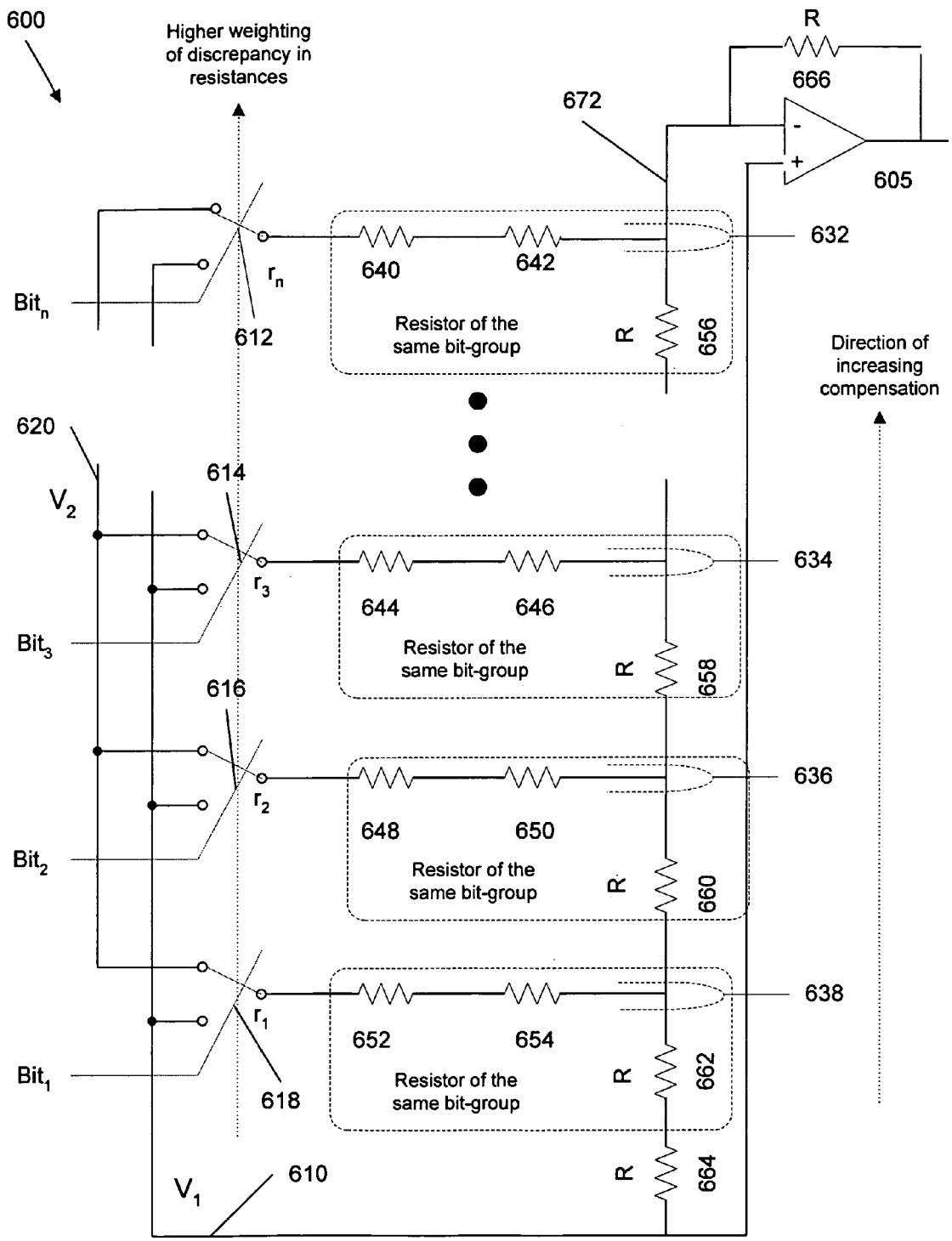
FIG. 6 is a schematic of an R-2R ladder according to an embodiment of the present invention.

FIG. 6 shows a circuit that compensates for a variance in the resistance of the resistors and the switches according to an embodiment of the invention. The ladder 600 is again similar to the ladders 100 and 500. As mentioned above, any variance of the matching conditions, which require the resistance of a rung to be equal to the resistance of the circuit below the rung, is magnified as the Bit number becomes more significant. The arrow pointing upwards along the switches signifies the direction of higher weighting of resistance mismatch. The weighting is higher due to the higher bits contributing more to the higher voltage according to the formula with $$n=4, \quad V_{out}=(V_2-V_1)\left(\frac{Bit_1}{16}+\frac{Bit_2}{8}+\frac{Bit_3}{4}+\frac{Bit_4}{2}\right).$$

In order to compensate for this variance, the errors of the higher voltages associated with the more significant Bits are dampened. This is accomplished by a controlled increase in the compensation by progressively changing the resistance of similarly situated resistors across bit-groups. A bit-group includes the resistors on a rung and the resistors between successive rungs, as well as the switch in a rung. For example, resistors 652, 654, and 662 belong to the same bit-group. The increase in the compensation may be attained by a progressive decrease or increase of the resistance of selected resistors across bit-groups. The controlled increase in the compensation may also compensate for the finite resistance of the switches.

In one embodiment, the effective resistance of each rung is decreased. This decreased resistance is signified by the arrow on the right side of FIG. 6 with the caption of "direction of increasing compensation." The compensation acts to provide an increase in the voltage from one step to another. If the resistance of each rung is a bit less than the last rung, there is a higher probability that the voltage will increase. This may introduce an error that the voltage may be higher than the ideal voltage. However, depending on the application, this error is outweighed by the necessity to have a monotonically increasing function of the output voltage versus the increasing binary input.

The decrease in the effective resistance of the resistors of the same rung may be accomplished by any number of variations of changing the resistors. For example, one or both of the resistors on a rung may be created to have a resistance of less than R. Thus, in one embodiment, the resistances of the rungs have the following relation $R_{632} \leq R_{634} \leq R_{636} \leq R_{638}$. Alternatively, in another embodiment, each vertical resistor just below each rung may be increased. For example in FIG. 6, the resistances of the resistors could have the relation $R_{656} \geq R_{658} \geq R_{660} \geq R_{662}$.

The type of progressive change may vary depending on the voltages and the values of the resistors and switches. In one embodiment, the change can be a linear decrease. In other embodiments, the decrease could be non-linear. For example, the increase could be exponential, logarithmic, polynomial, or other suitable functional relationships.

In some embodiments, the progressive change may be over a few bit-groups at a time. Thus, the resistance of several rungs may be equal with the next rung decreasing in resistance. This gives a generally decreasing change in the resistances. For example, the resistance of rungs associated with $Bit_3$ and $Bit_4$ could be the same, and the resistance of rungs associated with $Bit_5$ and $Bit_6$ could be decreased by the same amount.

In other embodiments, the resistance of the resistors in between any number of successive rungs may be equal with the next rung increasing in resistance. For example, the resistance of resistors 662 and 660 could be the same, and the resistance of resistor 658 could then be increased.

In embodiments with a linear change in the resistors, the change may be accomplished as follows. The effective resistance of the rung associated with $Bit_1$ is decreased by a value $\Delta$. The effective resistance of the rung associated with $Bit_2$ would be decreased by a value $2\Delta$. In other embodiments, a similar progression could be made by increasing the resistors along the output of bit-group 1 and bit-group 2.

In another embodiment, the resistors of the rung associated with the LSB is unchanged. The effective resistance of the rung associated with Bit 2 is decreased by a value $\Delta$. The effective resistance of bit group 3 would be decreased by a value $2\Delta$. In another embodiment, the resistors in the bit-groups on the vertical side of ladder 600 can be progressively increased by a value of $\Delta$.

In another embodiment, the effective resistance of the rung associated with $Bit_1$ is decreased by a value r. The effective resistance of the rung of $Bit_2$ would be decreased by a value r−$\Delta$. The effective resistance of the rung of $Bit_3$ would be decreased by a value r−$2\Delta$.

In another embodiment, the effective resistance of the rung associated with $Bit_1$ is decreased by a value r−$\Delta$. The effective resistance of the rung of $Bit_2$ would be decreased by a value r–2Δ. The effective resistance of the rung of $Bit_3$ would be decreased by a value r–3Δ.

One skilled in the art would recognize the many different numerical progressions that can be used. Additionally, the ladders in FIGS. 5 and 6 could also be a 2R–4R ladder or any other similar combination providing approximately uniform voltage steps.

One skilled in the art would appreciate that not all embodiments of the present invention will achieve a completely monotonically continuous output voltage. Depending on how well the resistor values are tuned, the compensation may have different levels of effectiveness. However, some embodiments will provide for a monotonically increasing output voltage. Other embodiments will provide for a linear output to within high tolerances.

Figure 7:
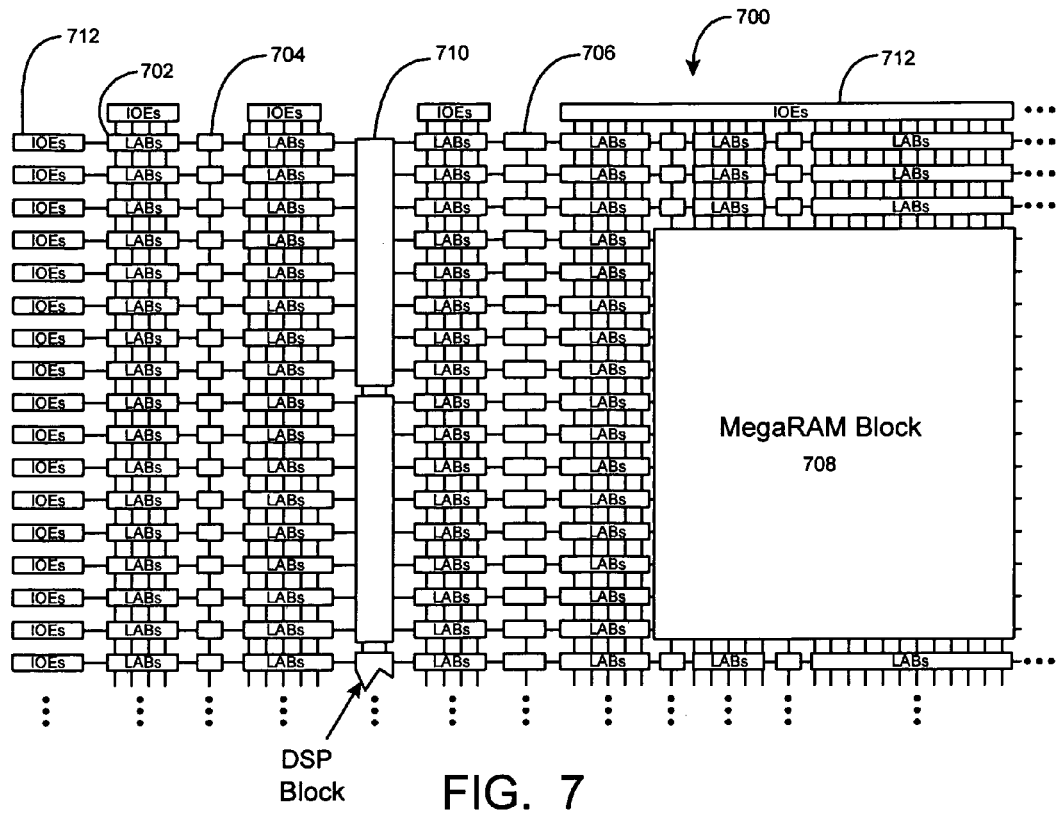
FIG. 7 is a simplified block diagram of a programmable logic device that does benefit by incorporating embodiments of the present invention.

FIG. 7 is a simplified partial block diagram of an exemplary high-density programmable logic device 700 wherein techniques according to the present invention can be utilized. PLD 700 includes a two-dimensional array of programmable logic array blocks (or LABs) 702 that are interconnected by a network of column and row interconnections of varying length and speed. LABs 702 include multiple (e.g., 10) logic elements (or LEs), an LE being a small unit of logic that provides for efficient implementation of user defined logic functions.

PLD 700 also includes a distributed memory structure including RAM blocks of varying sizes provided throughout the array. The RAM blocks include, for example, 512 bit blocks 704, 4K blocks 706 and an M-Block 708 providing 512K bits of RAM. These memory blocks may also include shift registers and FIFO buffers. PLD 700 further includes digital signal processing (DSP) blocks 710 that can implement, for example, multipliers with add or subtract features.

It is to be understood that PLD 700 is described herein for illustrative purposes only and that the present invention can be implemented in many different types of PLDs, FPGAs, and the other types of digital integrated circuits.

Figure 8:
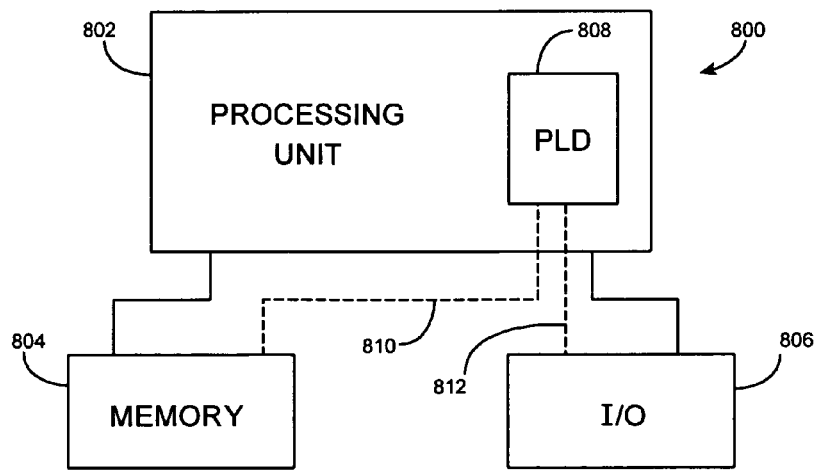
FIG. 8 is a block diagram of an electronic system that does benefit by incorporating embodiments of the present invention.

While PLDs of the type shown in FIG. 7 provide many of the resources required to implement system level solutions, the present invention can also benefit systems wherein a PLD is one of several components. FIG. 8 shows a block diagram of an exemplary digital system 800, within which the present invention may be embodied. System 800 can be a programmed digital computer system, digital signal processing system, specialized digital switching network, or other processing system. Moreover, such systems may be designed for a wide variety of applications such as telecommunications systems, automotive systems, control systems, consumer electronics, personal computers, electronic displays, Internet communications and networking, and others. Further, system 800 may be provided on a single board, on multiple boards, or within multiple enclosures.

System 800 includes a processing unit 802, a memory unit 804 and an I/O unit 806 interconnected together by one or more buses. According to this exemplary embodiment, a programmable logic device (PLD) 808 is embedded in processing unit 802. PLD 808 may serve many different purposes within the system in FIG. 8. PLD 808 can, for example, be a logical building block of processing unit 802, supporting its internal and external operations. PLD 808 is programmed to implement the logical functions necessary to carry on its particular role in system operation. PLD 808 may be specially coupled to memory 804 through connection 810 and to I/O unit 806 through connection 812.

Processing unit 802 may direct data to an appropriate system component for processing or storage, execute a program stored in memory 804 or receive and transmit data via I/O unit 806, or other similar function. Processing unit 802 can be a central processing unit (CPU), microprocessor, floating point coprocessor, graphics coprocessor, hardware controller, microcontroller, programmable logic device programmed for use as a controller, network controller, and the like. Furthermore, in many embodiments, there is often no need for a CPU.

For example, instead of a CPU, one or more PLD 808 can control the logical operations of the system. In an embodiment, PLD 808 acts as a reconfigurable processor, which can be reprogrammed as needed to handle a particular computing task. Alternately, programmable logic device 808 may itself include an embedded microprocessor. Memory unit 804 may be a random access memory (RAM), read only memory (ROM), fixed or flexible disk media, PC Card flash disk memory, tape, or any other storage means, or any combination of these storage means.

What is claimed is:

1. An integrated circuit of an R-2R ladder digital to analog converter, comprising:
   a plurality of bit-groups, each comprising:
      a rung circuit comprising:
         a switching device that receives binary input and has a resistance; and
         a first resistance having a first terminal connected to the switching device;
      a second resistance having a first terminal connected to a second terminal of the first resistance, wherein the first resistance has a first nominal value of 2R and the second resistance has a second nominal value of R;
   wherein the second terminal of the first resistance of each rung circuit is connected to a second terminal of the second resistance of a different bit-group; and
   wherein, for at least one bit-group of the plurality of bit-groups, at least one of the first resistance significantly differs from the first nominal value and the second resistance significantly differs from the second nominal value such that the resistance of the switching device of the at least one bit-group is compensated.

2. The integrated circuit of claim 1, wherein the resistance of the at least one of the first resistance and the second resistance of the at least one bit-group is such that the resistance of the rung circuit of the at least one bit-group is approximately equal to the second resistance of the at least one bit-group plus the resistance of a circuit connected to the second terminal of the second resistance.

3. The integrated circuit of claim 2, wherein the at least one of the first resistance and the second resistance of the at least one bit-group is the first resistance of the at least one bit-group, and wherein the first resistance is the first nominal value minus approximately the resistance of the switching device of the at least one bit-group.

4. The integrated circuit of claim 2, wherein the at least one of the first resistance and the second resistance of the at least one bit-group is the second resistance of the one bit-group, and wherein the second resistance is the second nominal value plus approximately one-half of the resistance of the switching device of the at least one bit-group.

5. The integrated circuit of claim 2, wherein the average resistance of the plurality of bit-groups generally decrease or increase from a first end of the ladder to a second end of the ladder.

6. The integrated circuit of claim 2 wherein the resistance of at least one of the first resistance and the second resistance of each bit-group is such that the resistance of the rung circuit of each bit-group is approximately equal to the second resistance of that bit-group plus the resistance of a circuit connected to the second terminal of the second resistance of that bit-group.

7. The integrated circuit of claim 2 wherein the first resistance consists of two resistors and the second resistance consists of one resistor.

8. The integrated circuit of claim 1, wherein the average resistance of the plurality of bit-groups generally decrease or increase from a first end of the ladder to a second end of the ladder.

9. The integrated circuit of claim 8, wherein the decrease or increase in resistance is linear.

10. The integrated circuit of claim 8 wherein the resistance of at least one of the first resistance and the second resistance of each of the plurality of bit-groups is such that the resistance of the rung circuit of each bit-group is less than the second resistance of that bit-group plus the resistance of a circuit connected to the second terminal of the second resistance of that bit-group.

11. A method of maintaining linearity in the output of an R-2R ladder digital to analog converter, wherein the ladder comprises a plurality of bit-groups which each comprise a rung circuit, comprising a switching device that receives binary input and has a resistance and a first resistance having a first terminal connected to the switching device, and a second resistance having a first terminal connected to a second terminal of the first resistance, wherein the first resistance has a first nominal value of 2R and the second resistance has a second nominal value of R, and wherein the second terminal of the first resistance of each rung circuit is connected to a second terminal of the second resistance of a different bit-group, comprising:
creating, for at least one bit-group of the plurality of bit-groups, at least one of the first resistance to significantly differ from the first nominal value and the second resistance to significantly differ from the second nominal value such that the resistance of the switching device of the at least one bit-group is compensated.

12. The method of claim 11, wherein the resistance of the at least one of the first resistance and the second resistance of the at least one bit-group is such that the resistance of the rung circuit of the at least one bit-group is approximately equal to the second resistance of the at least one bit-group plus the resistance of a circuit connected to the second terminal of the second resistance.

13. The method of claim 12, wherein the at least one of the first resistance and the second resistance of the at least one bit-group is the first resistance of the one bit-group, and wherein the first resistance is the first nominal value minus approximately the resistance of the switching device of the at least one bit-group.

14. The method of claim 12, wherein the at least one of the first resistance and the second resistance of the at least one bit-group is the second resistance of the one bit-group, and wherein the second resistance is the second nominal value plus approximately one-half of the resistance of the switching device of the at least one bit-group.

15. The method of claim 12, wherein the average resistance of the plurality of bit-groups generally decrease or increase from a first end of the ladder to a second end of the ladder.

16. The method of claim 11, wherein the average resistance of the plurality of bit-groups generally decrease or increase from a first end of the ladder to a second end of the ladder.

17. The method of claim 16, wherein the decrease or increase in resistance is linear.

18. An R-2R ladder digital to analog converter, comprising:
a plurality of bit-groups, comprising
a plurality of rung circuits, each comprising
a switching device that receives binary input and has a resistance; and
a first resistance having a first terminal connected to the switching device;
a second resistance having a first terminal connected to a second terminal of the first resistance, wherein the first resistance has a nominal value of twice the second resistance, and wherein the second terminal of the first resistance of each rung circuit of the plurality of rung circuits is connected to a second terminal of a second resistance of a different bit-group; and
a third resistor having a first terminal connected to the second terminal of the second resistance of a least significant bit-group and having a second terminal directly connected to a ground,
wherein the first resistance of each bit-group of the plurality of bit-groups plus the resistance of the switching device approximately equals the second resistance of the same bit-group plus a resistance of a circuit connected to the second terminal of the second resistance.

19. The converter circuit of claim 18, wherein the first resistance of each bit-group is 2R minus approximately the resistance of the switching device of the same bit-group, where R is the resistance of the second resistance of the same bit-group.

20. The converter circuit of claim 18, wherein the second resistance of each bit-group is R plus approximately one-half of the resistance of the switching device of the same bit-group, where R is one-half of the first resistance of the same bit-group.

21. The converter circuit of claim 18, further comprising:
an amplifier having a first input connected to the second terminal of the third resistor and having a second input connected to the second terminal of the first resistance of a most significant bit-group.

* * * * *